United States Patent [19]

Murray et al.

[11] 4,357,584
[45] Nov. 2, 1982

[54] ACOUSTIC WAVE DEVICES

[75] Inventors: Robert J. Murray, Burgess Hill; Richard F. Mitchell, Merstham, both of England

[73] Assignee: U.S. Philips Corporation, New York, N.Y.

[21] Appl. No.: 236,424

[22] Filed: Feb. 20, 1981

[30] Foreign Application Priority Data

Feb. 21, 1980 [GB] United Kingdom ............... 8005926

[51] Int. Cl.³ .................. H03H 9/64; H03H 9/25
[52] U.S. Cl. ............................. 333/195; 333/194; 333/196
[58] Field of Search ............................. 333/150-155, 333/193-196; 310/313 R, 313 A, 313 B, 313 C, 313 D; 331/107 A; 330/5.5

[56] References Cited

U.S. PATENT DOCUMENTS 4,079,342 3/1978 Solie .................................. 333/195

Primary Examiner—Marvin L. Nussbaum
Attorney, Agent, or Firm—Robert T. Mayer; Bernard Franzblau

[57] ABSTRACT

Figure 5:
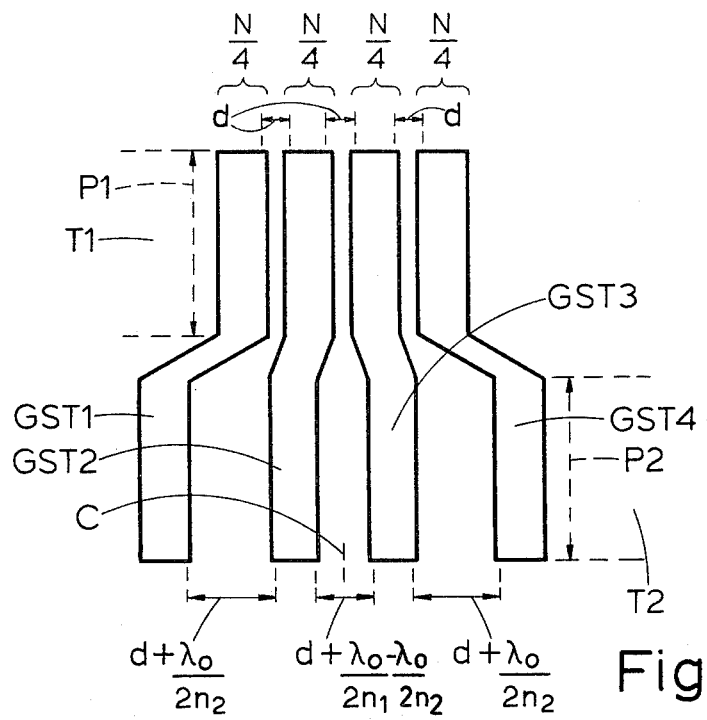
Figure 6:
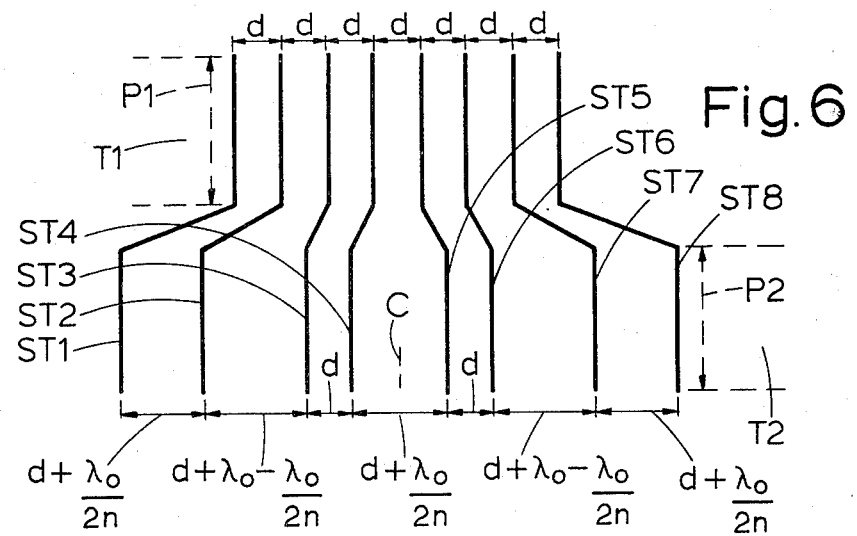

A surface acoustic wave bandpass filter consists of input and output interdigital transducers (IP, OP) with an interposed track changing multistrip array (MSA). A conventional broadband array (MSA) is divided into two groups of strips with respect to a center of symmetry (C) separated by different distances along the input track (T1) and the output track (T2) such that the array (MSA) suppresses a predetermined frequency. If the input and output transducers (IP, OP) both have a double electrode configuration, electrode separation $\lambda_o/4$, providing a fundamental passband at a corresponding frequency $f_o$ and an equal amplitude passband at the third harmonic $3f_o$, then a separation difference of $\lambda_o/6$ between the groups of the array (MSA) in the two tracks (T1, T2) can suppress the third harmonic passband in the filter output. The two groups of the multistrip array may be further sub-divided to suppress more than one frequency (FIG. 5). Also a multistrip array arranged in groups to provide a shaped bandpass response may have each group divided to suppress a selected harmonic passband of the array (FIG. 6).

10 Claims, 6 Drawing Figures

ACOUSTIC WAVE DEVICES

The present invention relates to acoustic wave devices, and in particular to such devices including a track changing multistrip array arranged between input and output transducers on a substrate able to propagate acoustic waves at a surface thereof. Such devices are used, for example, as bandpass electrical filters.

Surface acoustic wave (SAW) bandpass electrical filters are well known which consist of an input interdigital transducer and an output interdigital transducer with an interposed track changing multistrip array on a high coupling piezoelectric substrate; e.g. Y-Z lithium niobate. The major advantage of the multistrip array in these filters is that it provides relative suppression of bulk wave spuriae, and a further advantage is that it allows apodization weighting of both transducers.

The amplitude-frequency response of each transducer in these filters has a fundamental passband which is repeated with a certain amplitude at particular harmonics dependent on the sampling configuration of the transducer, that is to say the centre-to-centre separation period and the mark-to-space ratio of the transducer electrodes. If the input and output transducers have different sampling configurations then this may result in suppression of certain of these harmonic passbands in the combined amplitude-frequency response of the filter. This suppression will not occur if the two transducers have the same sampling configuration. An interdigital transducer having electrodes with a centre-to-centre separation period of a quarter wavelength of surface acoustic waves at the centre frequency of the fundamental passband, known as a double or split electrode transducer, and with an electrode mark-to-space ratio of one-to-one has a third harmonic passband response which is of nearly equal amplitude to that of the fundamental passband. A major advantage of the double electrode configuration transducer is that interactions within the transducer which cause undesired ripples in the amplitude-frequency response are minimised, and for this reason it is common to use this configuration for both the input and output transducers. However, the unsuppressed third harmonic response resulting from this use can be a significant disadvantage in certain filter applications.

An object of the invention is to enable the above-mentioned disadvantage to be overcome.

According to the invention there is provided an acoustic wave device including a substrate able to propagate acoustic waves at a surface thereof, input transducing means arranged to launch acoustic wave energy along a first propagation track at said surface, output transducing means arranged to receive acoustic wave energy from a second propagation track at said surface, and electrical coupling means arranged to receive acoustic wave energy from the input transducing means in the first track and to relaunch at least part of that energy as acoustic wave energy towards the output transducing means in the second track. The coupling means consists of an array of conducting strips across the first track and an array of conducting strips across the second track, the conducting strips of each array being discrete parallel strips electrically insulated from each other and strips of the two arrays being electrically connected in pairs with each pair consisting of one strip from each array. The invention is characterised in that the strips of the coupling means are arranged in at least one first group, the or each first group consisting of two sub-groups and each sub-group consisting of strips from both arrays, in that the two sub-groups of the or each first group are separated by different distances along the first and second tracks, and in that the composition of the two sub-groups of the or each first group and their separation along the first and second tracks are selected such that any acoustic wave energy received from the input transducing means by the coupling means in the first track at a predetermined frequency is relaunched in the second track at that frequency with equal magnitude but in antiphase by the two sub-groups of the or each first group whereby acoustic wave energy at that frequency is suppressed at the output transducing means so it is effectively not received by the output transducing means.

Although the suppression of acoustic wave transmission by the multistrip array will be a maximum at said predetermined frequency, there will also be suppression to a lesser extent over a range of frequencies centered on said predetermined frequency. This is of particular advantage in the case where the acoustic wave device is a bandpass filter having harmonically repeated passbands. Thus, according to the invention, there may be provided an acoustic wave device as described in the previous paragraph in which the input transducing means and the output transducing means have a combined amplitude-frequency response having harmonically repeated passbands of predetermined shape, and in which the composition and separation of the two sub-groups of the or each first group provide a stopband centered on said predetermined frequency such that a selected said passband is suppressed. Furthermore, where the input and output transducing means both comprise double electrodes such that said combined amplitude-frequency response includes a fundamental passband and a corresponding third harmonic passband, the selected said passband which is suppressed may be said third harmonic passband thus fulfilling the above-stated object of the invention.

It may be advantageous in an acoustic wave device according to the invention to have the multistrip array additionally suppress the transmission of acoustic waves to the output transducer at a frequency where suppression is not achieved by the above stated division of the array into sub-groups. This may be achieved by suitable division of the sub-groups. Thus, according to the invention, there may be provided an acoustic wave device as described in the penultimate paragraph in which said predetermined frequency is a first frequency, in which each sub-group is a first sub-group consisting of two second sub-groups, each second sub-group consisting of strips from both arrays, in which the two second sub-groups of each first sub-group are separated by different distances along the first and second tracks, and in which the composition of each said two second sub-groups and their separation along the first and second tracks are selected such that any acoustic wave energy received from the input transducing means by the coupling means in the first track at a predetermined second frequency different from said first frequency is relaunched in the second track at that second frequency with equal magnitude but in antiphase by the two second sub-groups of each first sub-group whereby acoustic wave energy at that second frequency is not received by the output transducing means.

Surface acoustic wave bandpass electrical filters are known, for example from an article by L. P. Solie in Applied Physics Letters, Vol 30, No 8, Apr. 15, 1977, in which the strips of a multistrip array are arranged in groups so as to provide a shaped passband amplitude-frequency response for the multistrip array. The invention is applicable to this type of device, and so according to the invention there may be provided an acoustic wave device as described in the ante-penultimate paragraph in which there is more than one first group, the composition and relative arrangement of the first groups being selected to provide an amplitude-frequency response of the coupling means having a fundamental and some harmonically repeated passbands of predetermined shape, and in which said predetermined frequency at which acoustic wave energy is not received by the output transducing means is within a said passband. In this case the composition and separation of the two sub-groups of each first group may provide a stopband centered on said predetermined frequency such that a selected said passband of the coupling means is suppressed.

In devices according to the invention the acoustic waves which the substrate is able to propagate at a surface thereof may be conventional surface acoustic waves propagating in the surface of the substrate. The acoustic waves may otherwise be, for example, bulk acoustic waves propagating parallel and close to that surface of the substrate. The possible use of this type of bulk acoustic wave is mentioned in connection with delay line feedback oscillators in U.K. Patent Specification No. 1,451,326 and a range of rotated Y-cuts of quartz with propagation perpendicular to the X-axis suitable for this purpose is described in Electronics Letters, Mar. 3, 1977, Vol. 13, No. 5 at pages 128 to 130. The acoustic waves may also otherwise be, for example, piezoelectric leaky surface waves propagating along the X axis of a 41° or 64° rotated Y-cut plane of lithium niobate as described in an article by K. Yamanouchi and K. Shibayama in Journal of Applied Physics, Vol. 43, No. 3, Mar. 3, 1972 at pages 856 to 862.

Figure 1:
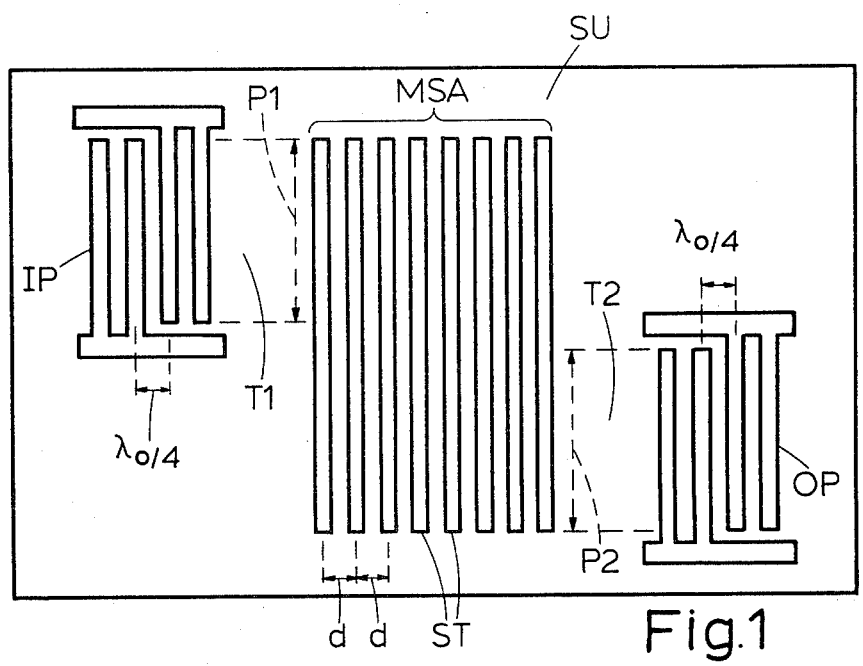
Figure 2:
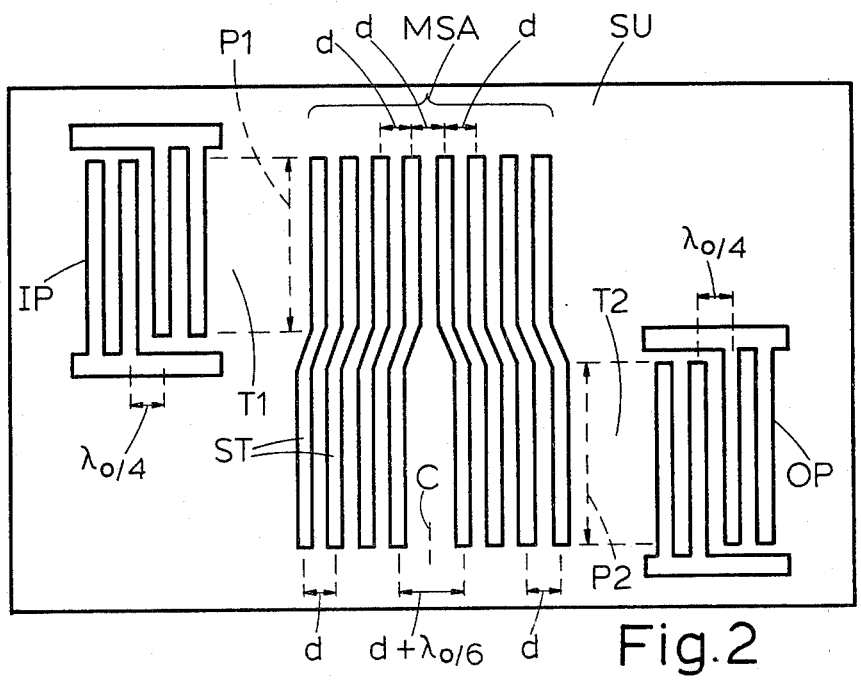
Figure 3:
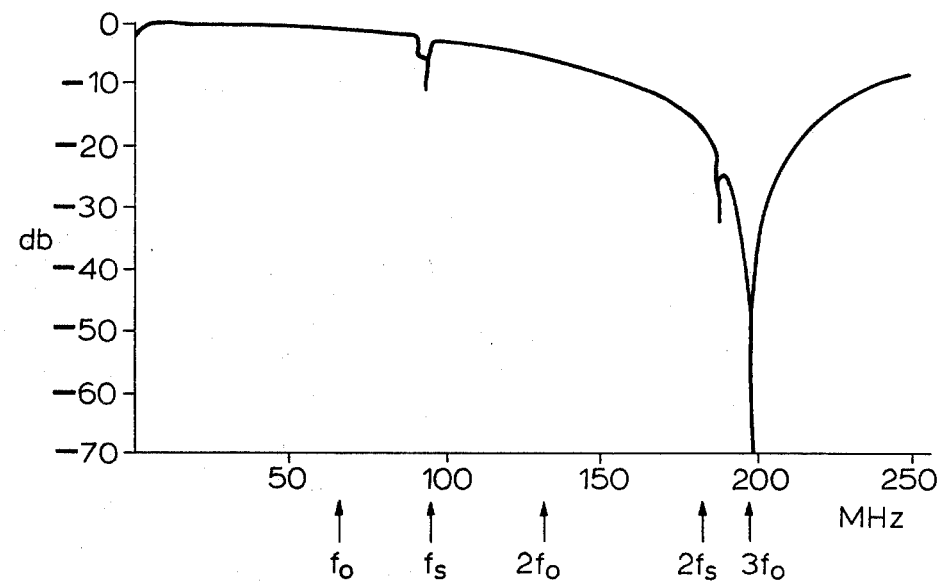
Figure 4:
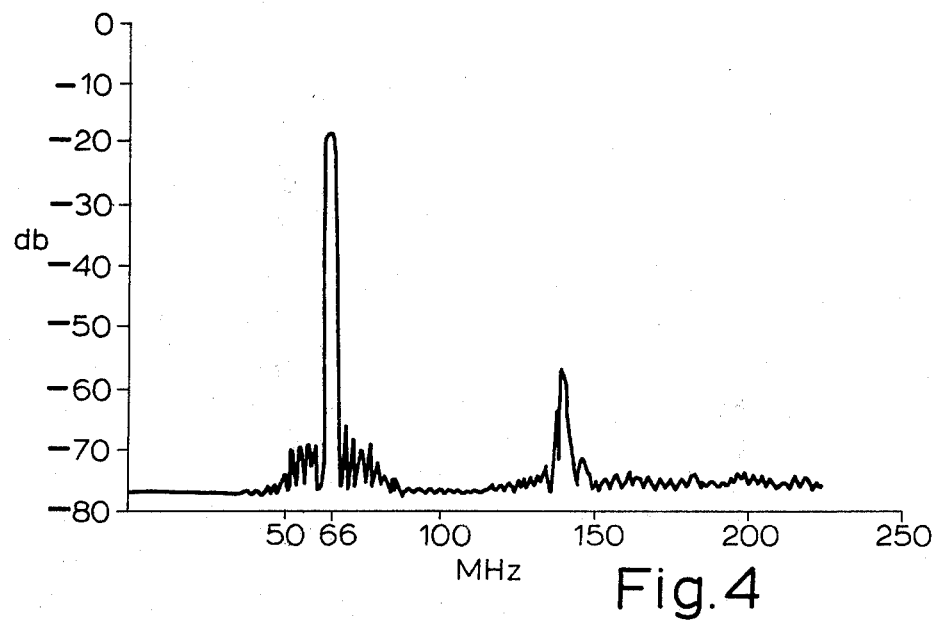

The invention will now be described in more detail with reference to the accompanying drawings, in which:

FIG. 1 shows schematically in plan view a known surface acoustic wave bandpass electrical filter incorporating double electrode input and output interdigital transducers with an interposed conventional track changing multistrip coupler, FIG. 2 shows the filter of FIG. 1 with a modified multistrip coupler according to the invention for suppression of a first frequency, FIG. 3 shows a predicted amplitude-frequency response of an example of a multistrip coupler as shown in FIG. 2, FIG. 4 shows the measured amplitude-frequency response of an example of a surface acoustic wave filter of the type shown in FIG. 2 and including the multistrip coupler whose response is shown in FIG. 3, FIG. 5 shows a schematic plan view of another multistrip coupler for use in a device according to the invention, which coupler is further divided with respect to the coupler shown in FIG. 2 so as to provide suppression at both said first frequency and at a second different frequency, and FIG. 6 shows a schematic plan view of yet another multistrip coupler for use in a device according to the invention, the strips of the coupler being arranged in groups to provide a shaped passband amplitude-frequency response of the coupler and in which each group is split to provide suppression of a selected harmonic passband of the coupler.

Referring now to FIG. 1 there is shown a substrate SU able to propagate surface acoustic waves at a surface thereof, input transducing means IP arranged to launch surface acoustic wave energy along a first propagation track T1 at the surface, output transducing means OP arranged to receive surface acoustic wave energy from a second propagation track T2 at the surface and electrical coupling means MSA arranged to receive surface acoustic wave energy from the input transducing means IP in the first track T1 via an input port P1 and to relaunch at least part of that energy as surface acoustic wave energy towards the output transducing means OP in the second track T2 via an output port P2.

The input transducing means IP and the output transducing means OP are both interdigital transducers comprising double electrodes, that is to say having electrodes with a center-to-center separation period of a quarter wavelength $\lambda_o/4$ of surface acoustic waves at the centre frequency $f_o$ of a fundamental passband of the amplitude-frequency response of the transducer, and the mark-to-space ratio of the electrodes of the transducers is one-to-one. The combined amplitude-frequency response of the transducers IP and OP has harmonically repeated passbands of predetermined shape including a fundamental passband centered at the frequency $f_o$ and a third harmonic passband at a frequency $3f_o$ which is of nearly equal amplitude to that of the fundamental passband.

The electrical coupling means MSA consists of an array of a number N of discrete parallel conducting strips ST electrically insulated from each other. Each strip ST may be considered as a pair of strips in which one strip of the pair is part of an array of strips across the track T1, the other strip of the pair is part of an array of strips across the track T2 and the two strips of each pair are electrically connected.

The array MSA is a conventional track changing multistrip coupler in that the center-to-center separation period d between the strips ST is constant for the array of strips in each of the tracks T1 and T2 and is the same in both tracks. The operation of the conventional multistrip coupler has been described in detail in, for example, an article by F. G. Marshall et al. in IEEE Transactions 1973, MTT-21, pages 206 to 215. For the present purpose, its operation may be described simply as follows. Each strip ST may be considered as partially transferring the input signal from track T1 to track T2 with a constant phase shift. The total power transferred is a sine squared function of the number of strips N due to interactions within the coupler. The path length between the input port P1 and the output port P2 is constant for transfer via any strip ST. This means that the signals transferred by each strip ST add in phase over a very wide range of frequencies and hence the amplitude-frequency response of the conventional multistrip coupler is a very broad passband. This behaviour is modified in the immediate vicinity of the well known stopband frequency $f_s$ which is the frequency at which the strip period d is half a wavelength of surface acoustic waves and at harmonics of the frequency $f_s$. In general, when a conventional multistrip coupler is designed to track change a signal at a frequency $f_o$ (usually $f_o < f_s$) the coupler also transmits harmonics of $f_o$ (except in the region of the just-mentioned stopband harmonics). Thus in the known surface acoustic wave bandpass electrical filter shown in FIG. 1 the third harmonic passband at the frequency $3f_o$ is transmitted and input signals within that passband are present in the filter output.

Referring now to FIG. 2, there is shown the filter of FIG. 1 with a modified multistrip coupler according to the invention. The group of N strips ST of the coupler MSA is now split with respect to a centre of symmetry C into two sub-groups each consisting of N/2 strips, and the two sub-groups are separated by different distances d and $(d+\lambda o/6)$ along the tracks T1 and T2 respectively. Surface acoustic wave energy received by the coupler MSA via the input port P1 from the input transducer IP at the frequency $3f_o$ is relaunched at that frequency via the output port P2 with equal magnitude but in antiphase by the two sub-groups of the coupler MSA so that surface acoustic wave energy at the frequency $3f_o$ is not received by the output transducer OP.

An analysis technique suitable for the investigation of the frequency response of a multistrip array is described in an article by M. Feldmann and J. Henaff in the Proceedings of the IEEE Ultrasonics Symposium 1977 at pages 686 to 690. This analysis has been applied to a multistrip array as shown in FIG. 2 in which the strip period d is $0.35\lambda o$ with mark-to-space ratio one-to-one, the total number of strips N is 108 and the assumed piezoelectric coupling constant $k^2$ is 0.047 (for a Y-Z lithium niobate substrate). The predicted amplitude-frequency transmission response of this multistrip array is shown in FIG. 3 which is scaled for $f_o=66$ MHz. A null in the response at the frequency $3f_o$ is apparent. There is also a predicted suppression to a lesser extent over a range of frequencies centered on $3f_o$. In the case shown where $3f_o$ is 198 MHz the response is $-30$ db over a bandwidth of 8 MHz centered on 198 MHz. The suppression at $3f_o$ is achieved at the expense of a small transmission loss at $f_o$ of 1.25 db. The stopbands at $f_s=1.43f_o$ and at $2f_s$ are also in evidence.

A surface acoustic wave filter of the type shown in FIG. 2, that is to say having double electrode input and output transducers with a fundamental frequency $f_o=66$ MHz and a multistrip array as described in the previous paragraph on Y-Z lithium niobate has been made and the practical untuned frequency response of this filter measured with 50 ohm source and load impedances is shown in FIG. 4. The combined amplitude-frequency response of the input and output transducers has harmonically repeated passbands including a fundamental passband at $f_o$ (the bandwidth being 5 MHz centered on 66 MHz at 30 db down from the peak of the passband) and a corresponding passband of nearly equal amplitude at $3f_o$. The filter response shown in FIG. 4 shows that the passband response at $3f_o$ (198 MHz) has been completely suppressed. The response seen at 140 MHz is due to residual bulk waves.

Referring back to FIG. 2 the difference $\lambda o/6$ in the separation between the two sub-groups of the multistrip array along the tracks T1 and T2 respectively may be expressed as $\lambda o/2n$ where $n=3$. A signal input at the input port P1 of the array results in two output signals at the output port P2 which have a relative phase difference $\phi°$ at a frequency f defined by the equation $\phi=180 f/nf_o$ degrees. Thus at a frequency $f=nf_o$ the two signals have a phase difference of 180° and interfere destructively. Where $n=3$, a signal input at a frequency $3f_o$ will be suppressed; where n is another integer a corresponding other nth harmonic of the frequency $f_o$ will be suppressed. If n is not an integral number another frequency which is not a harmonic of $f_o$ may be chosen for suppression. Furthermore, whatever value is chosen for n there will also be suppression at odd harmonics of the frequency $nf_o$, for example where $n=3$ there will be suppression at $3f_o$, $9f_o$, $15f_o$, $21f_o$ etc.

Referring now to FIG. 5, there is shown a schematic plan view of another multistrip array for use in a device according to the invention, which array is further divided with respect to the multistrip array shown in FIG. 2 so as to provide suppression at two different frequencies. The four groups of strips GST1, GST2, GST3 and GST4 each consist of N/4 strips where N is the total number of strips in the array. All four groups are separated by the same distance d in the track T1. The groups GST2 and GST3 are separated by a distance $d+\lambda o/2n_1 - \lambda o/2n_2$ in the track T2; the groups GST1 and GST2 are separated by a distance $d+\lambda o/2n_2$ in the track T2; and the groups GST3 and GST4 are also separated by the distance $d+\lambda o/2n_2$ in the track T2. An input signal received by the multistrip array at a frequency $n_1 f_o$ at the input port P1 in the track T1 results in a first signal at the output port P2 due to the groups GST1 and GST2 which interferes destructively with a second signal at the output port P2 in the track T2 due to the groups GST3 and GST4 at the frequency $n_1 f_o$. An input signal received by the multistrip array at a frequency $n_2 f_o$ different from the frequency $n_1 f_o$ at the input port P1 results in a first signal at the output port P2 due to the group GST1 which interferes destructively with a second signal at the output port P2 due to the group GST2 at the frequency $n_2 f_o$ and also results in a third signal at the output port P2 due to the group GST3 which interferes destructively with a fourth signal at the output port P2 due to the group GST4 at the frequency $n_2 f_o$. Thus the two different frequencies $n_1 f_o$ and $n_2 f_o$ are both suppressed by the multistrip array. Further subdivision of each of the groups GST1 to GST4 could be provided for suppression of further different frequencies.

Referring now to FIG. 6, there is shown a schematic plan view of another multistrip array for use in a device according to the invention, the strips of the array being arranged in groups to provide a shaped passband amplitude-frequency response of the array and in which each group is split to provide suppression of a selected harmonic passband of the coupler. The array consists of a first group of two strips ST1 and ST2, a second group of four strips ST3, ST4, ST5 and ST6, and a third group of two strips ST7 and ST8, and has a centre of symmetry C. In the track T1 all the strips are separated by the same distance d. In the track T2, the strips ST1 to ST8 are separated by successive distances $d+\lambda o/2n$, $d+\lambda o-\lambda o/2n$, d, $d+\lambda o/2n$, d, $d+\lambda o-\lambda o/2n$ and $d+\lambda o/2n$.

The arrangement of the strips of the array into three groups of two, four and two strips respectively with a centre-to-centre separation between the groups of 3d in track T1 and $3d+\lambda o$ in track T2 provides an amplitude frequency response of the array having harmonically repeated shaped passbands including a fundamental passband centred on the frequency $f_o$. An input signal received by the multistrip array at a frequency $nf_o$ at the input port P1 in the track T1 results in a first signal at the output port P2 in the track T2 due to the strip ST1 which interferes destructively with a second signal at the output port P2 due to the strip ST2 at the frequency $nf_o$. The same input signal results in a third signal due to the strips ST3 and ST4 which interferes destructively with a fourth signal due to the strips ST5 and ST6 at the output port P2 at the frequency $nf_o$ and the same input signal results in a fifth signal due to the strip ST7 which interferes destructively with a sixth signal due to the strip ST8 at the output port P2 at the frequency $nf_o$. The signal at $nf_o$ is thus suppressed by the multistrip array. Signals over a range of frequencies centred on $nf_o$ will also be suppressed and so the array may be arranged for suppression of a selected one of its harmonic passbands, for example the third harmonic passband at $3f_o$ when $n=3$.

The above-mentioned article by M. Feldmann and J. Henaff in the Proceedings of the IEEE Ultrasonics Symposium 1977 at pages 686 to 690 mentions two types of multistrip array, that is to say a transmitting array (MTA) and a reflecting array (MRA). The geometry of multistrip reflecting arrays is not suitable for adaptation within the scope of the present invention.

The present invention is related to the invention described in U.S. patent application Ser. No. 236,357 filed Feb. 20, 1981, the disclosure of which is hereby incorporated by reference into this application.

We claim:

1. An acoustic wave device comprising a substrate able to propagate acoustic waves at a surface thereof, input transducing means arranged to launch acoustic wave energy along a first propagation track at said surface, output transducing means arranged to receive acoustic wave energy from a second propagation track at said surface, and electrical coupling means arranged to receive acoustic wave energy from the input transducing means in the first track and to relaunch at least part of that energy as acoustic wave energy towards the output transducing means in the second track, the coupling means comprising an array of conducting strips across the first track and an array of conducting strips across the second track, the conducting strips of each array being discrete parallel strips electrically insulated from each other with strips of the two arrays being electrically connected in pairs with each pair comprising one strip from each array, the strips of the coupling means being arranged in at least one first group, the or each first group comprising two sub-groups and each sub-group including strips from both arrays, the spacing between the two sub-groups of a first group in the first track being different from the spacing between the two sub-groups of the first group in the second track, and wherein the composition of the two sub-groups of the or each first group and their separation along the first and second tracks are selected such that any acoustic wave energy received from the input transducing means by the coupling means in the first track at a predetermined frequency is relaunched in the second track at that frequency with equal magnitude but in antiphase by the two sub-groups of the or each first group whereby acoustic wave energy at that frequency is suppressed at the output transducing means.

2. An acoustic wave device as claimed in claim 1, in which the input transducing means and the output transducing means have a combined amplitude-frequency response having harmonically repeated passbands of predetermined shape, and in which the composition and separation of the two sub-groups of the or each first group provide a stopband centred on said predetermined frequency such that a selected said passband is suppressed.

3. An acoustic wave device as claimed in claim 2, in which the input and output transducing means both comprise double electrodes such that said combined amplitude-frequency response includes a fundamental passband and a corresponding third harmonic passband, and in which the selected said passband which is suppressed is said third harmonic passband.

4. An acoustic wave device as claimed in claim 1, in which said predetermined frequency is a first frequency, in which each sub-group is a first sub-group comprising two second sub-groups, each second sub-group including strips from both arrays, in which the two second sub-groups of each first sub-group are separated by different distances along the first and second tracks, and in which the composition of each said two second sub-groups and their separation along the first and second tracks are selected such that any acoustic wave energy received from the input transducing means by the coupling means in the first track at a predetermined second frequency different from said first frequency is relaunched in the second track at that second frequency with equal magnitude but in antiphase by the two second sub-groups of each first sub-group whereby acoustic wave energy at that second frequency is suppressed at the output transducing means.

5. An acoustic wave device as claimed in claim 1, in which there is more than one first group, the composition and relative arrangement of the first groups being selected to provide an amplitude-frequency response of the coupling means having a fundamental and some harmonically repeated passbands of predetermined shape, and in which said predetermined frequency at which acoustic wave energy is suppressed at the output transducing means is within a said passband.

6. An acoustic wave device as claimed in claim 5, in which the composition and separation of the two sub-groups of each first group provide a stopband centred on said predetermined frequency such that a selected said passband of the coupling means is suppressed.

7. An acoustic wave device as claimed in claim 1, wherein the two sub-groups in one of said tracks are spaced apart by a distance d and the two sub-groups in the other one of said first and second tracks are spaced apart by a distance $d + \lambda_o/2n$, where $\lambda_o$ is the wavelength of acoustic surface waves at the center frequency $f_o$ of a desired fundamental pass band of the acoustic wave device and n is a positive integer.

8. An acoustic wave device as claimed in claim 7 wherein said first group comprises N conducting strips and each of the two sub-groups comprises N/2 strips, and the individual strips of each sub-group in the first and second tracks are spaced apart by a distance d.

9. An acoustic wave device as claimed in claim 1 further comprising at least one other first group of discrete parallel conducting strips electrically connected in pairs beween the first and second tracks and comprising two further sub-groups with each sub-group including strips from each track, wherein the sub-groups in one of said tracks are all spaced apart by a distance d, at least one pair of adjacent sub-groups in the other track are spaced apart by a distance $d + \lambda_o/2n_2$, and at least one other pair of adjacent sub-groups in the other track are spaced apart by a distance $d + \lambda_o/2n_1 - \lambda_o/2n_2$, where $\lambda_o$ is the wavelength of acoustic surface waves at the center frequency $f_o$ of a desired fundamental passband of the acoustic wave device, and $n_1$ and $n_2$ are first and second positive integers, whereby the acoustic wave device provides suppression of acoustic wave energy at the output transducing means at two different predetermined frequencies equal to $n_1 f_o$ and $n_2 f_o$, respectively.

10. An acoustic wave device as claimed in claim 1, wherein the conducting strips are arranged into three groups of two, four and two strips, respectively, with a center-to-center separation between the groups in one track of 3d and a center-to-center separation between the groups in the other track of 3d+λo, where λo is the wavelength of acoustic surface waves at the center frequency $f_o$ of a desired fundamental pass band of the acoustic wave device, whereby the acoustic wave device provides suppression of acoustic wave energy at the output transducing means at a predetermined frequency $nf_o$, where n is a positive integer.

* * * * *